(12) United States Patent
Borges et al.

(10) Patent No.: US 10,217,600 B1
(45) Date of Patent: Feb. 26, 2019

(54) INDIRECTLY HEATED CATHODE ION SOURCE ASSEMBLY

(71) Applicants: Carlos F. M. Borges, Roslyn, NY (US); Manuel A. Jerez, Roosevelt, NY (US); Amnon Parizat, Old Westbury, NY (US)

(72) Inventors: Carlos F. M. Borges, Roslyn, NY (US); Manuel A. Jerez, Roosevelt, NY (US); Amnon Parizat, Old Westbury, NY (US)

(73) Assignee: ION TECHNOLOGY SOLUTIONS, LLC, Mineola, NY (US)

(*) Notice: Subject to any disclaimer, the term of this patent is extended or adjusted under 35 U.S.C. 154(b) by 0 days.

(21) Appl. No.: 15/788,428

(22) Filed: Oct. 19, 2017

(51) Int. Cl.
*H01J 37/08* (2006.01)
*H01J 37/317* (2006.01)

(52) U.S. Cl.
CPC ............ *H01J 37/08* (2013.01); *H01J 37/317* (2013.01)

(58) Field of Classification Search
USPC ....................................................... 250/426
See application file for complete search history.

(56) References Cited

U.S. PATENT DOCUMENTS

| | | | | |
|---|---|---|---|---|
| 3,581,093 A | * | 5/1971 | Carr ..................... | H05H 3/06 376/116 |
| 4,135,093 A | * | 1/1979 | Kim ..................... | H01J 27/10 250/423 R |
| 6,878,946 B2 | * | 4/2005 | Farley .................. | H01J 1/20 250/424 |
| 7,138,768 B2 | * | 11/2006 | Maciejowski ........ | H01J 27/022 315/111.81 |
| 8,253,334 B2 | * | 8/2012 | Jerez .................... | H01J 27/08 250/426 |

* cited by examiner

*Primary Examiner* — Phillip A Johnston
(74) *Attorney, Agent, or Firm* — Francis C. Hand; Carella, Byrne, et al

(57) ABSTRACT

The indirectly heated cathode ion source assembly employs a cathode cup unit and filament arrangement wherein the filament has a flat face spaced from a tungsten disc-shaped body and is disposed in a space that is surrounded by a thermal barrier to reduce thermal losses. The thermal barrier is formed by a plurality of concentric foils that are closely spaced.

7 Claims, 10 Drawing Sheets

INDIRECTLY HEATED CATHODE ION SOURCE ASSEMBLY

FIELD OF THE INVENTION

This invention relates to an indirectly heated cathode ion source assembly. More particularly, this invention relates to an ion implanter having a high efficient cathode emitter that emits thermal electrons to ionize a gas inside of an arc chamber to form a plasma to generate an ion beam for beam treatment of a work piece or faces in a workpiece processing tool.

BACKGROUND OF THE INVENTION

Ion implantation is a process used to dope impurity ions into a semiconductor substrate. In accordance with the process, an ion beam is directed from an ion source chamber toward a substrate. The depth of implantation into the substrate is based on the ion implant energy and mass of the ions generated in the source chamber. A precise doping profile in the substrate is critical to proper device operation. One or more types of ion species may be implanted in different doses and at different energy levels to obtain desired device characteristics.

During implantation or other workpiece processing, accelerated ions will sputter materials off any impinged surface eroding the surface.

Ion sources that generate the ion beams used in existing implanters are typically called arc ion sources and can include heated filament cathodes for creating ions that are shaped into an appropriate ion beam for wafer treatment.

U.S. Pat. No. 5,497,006 describes an ion source having a cathode and anti-cathode (repeller) disposed in the gas confinement chamber. The ion source further includes a solid aluminum block for retaining the gas confinement chamber with a support portion of the base. The cathode is a tubular conductive body and endcap that partially extends into the gas confinement chamber. A filament is supported within the tubular body and emits electrons that heat the endcap through electron bombardment, thermionically emitting the ionizing electrons into gas confinement chamber.

U.S. Pat. No. 8,253,334 also discloses a cathode sub-assembly comprised of a retainer, a cathode and collar, each of which has smooth unthreaded surfaces that slidably engage each other. A shield serves to hold the sub-assembly in a support plate. The cathode projects from the sub-assembly into an arc chamber with a tortuous path created therebetween for passage of the plasma flow.

U.S. Pat. No. 5,763,890 also discloses an arc ion source for use in an ion implanter. The ion source includes a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

U.S. Patent Application 2011/0156570 also discloses a cathode assembly for use in an ion implanter. The ion source includes a gas confinement chamber having a filament clamp assembly. The filament clamp assembly has a pair of bifurcate clamps to hold the connecting leads of a filament within a cavity of a cathode of a separate cathode assembly. The filament clamp assembly is mounted on the insulator block in self-aligning relation. The cathode assembly has a tungsten cathode with an internal cavity to receive the filament that is secured within a retainer shield made of tungsten, molybdenum and graphite by a threaded graphite cylindrical collar.

U.S. Pat. No. 7,750,313 proposes to improve the plasma generation efficiency and gas use efficiency as well as to ensure a longer service life an ion source. As described, a cathode holder of tubular shape is inserted into an opening and positioned such that a surface thereof opposes or surrounds a side surface of a cathode. The cathode is held in the cathode holder so that a front surface of the cathode will be positioned on the same plane as, outward from, or inward from the inner wall surface. The cathode holder is also provided with a tubular first heat shield surrounding the cathode with a space provided between the first heat shield and the cathode. A surface of the first heat shield is positioned to oppose or surround the side surface of the cathode. A filament is provided at a rear end of the cathode and a gap between the cathode holder and the plasma generating chamber is filled with an electrical insulating material.

U.S. Pat. No. 9,425,023 discloses a cathode that extends outward from the inside of an arc chamber in an axial direction and that emits a thermal electron into the arc chamber, a thermal reflector with a cylindrical shape provided around the cathode in a radial direction and extending in the axial direction, and a narrow structure configured to narrow a width in the radial direction of a gap between the cathode and the thermal reflector at a given position in the axial direction.

U.S. Pat. No. 9,659,755 discloses a plasma generator including an arc chamber having a plasma generation region in which plasma is generated in the inside thereof; a magnetic field generator is configured to apply a magnetic field to the plasma generation region; and a cathode is configured to extend in an axial direction along an applying direction of the magnetic field to the plasma generation region and is provided with a cathode cap that emits thermal electrons at a front end thereof. The cathode cap protrudes toward the inside of the arc chamber in the axial direction and has a shape of which a width in the radial direction perpendicular to the axial direction becomes smaller toward the inside of the arc chamber.

Other sources may drive RF, microwave or electron beam discharges to generate desired ions. These sources generate plasma densities 10-100 times lower than arc ion sources and are typically used with source materials that have low ionization potentials (species that are easy to ionize) or when the source chamber includes large ion extraction areas. Cold ion sources, such as shown in U.S. Pat. No. 6,975,072, can have source materials made of relatively low temperature materials, such as stainless steel, copper or aluminum. Hot sources, such as, arc ion sources expose the source chamber walls to an arc plasma at temperatures of several tens of thousands of degree Celsius and high thermal power densities which have required source components of prior art implanters to be made of high temperature, so called refractory, materials, such as molybdenum, tantalum or tungsten.

Accordingly, it is an object of the invention to improve the life performance of a cathode assembly during ion beam operation.

It is another object of the invention to provide an indirectly heated cathode (IHC) ion source assembly that can be used in all ion source arrangements.

It is another object of the invention to provide an indirectly heated cathode (IHC) ion source assembly that can be fitted in OEM implant systems as well as iTS ion sources.

It is another object of the invention to provide an improved cathode assembly structure for ion implanters that reduces the number of parts, improves the thermal electron emission, reduces the cathode erosion and reduces ion implanter downtime.

SUMMARY OF THE INVENTION

Briefly, the invention provides an indirectly heated cathode ion source assembly for use in creating a stream of ions.

The assembly includes a cathode cup unit, a thermal barrier and a filament.

The cathode cup unit is constructed of a disc-shaped body, a pair of semicircular elements concentric to and holding the body therebetween and a cylindrical retainer concentrically housing the body and elements and forming a thermal reflector.

The thermal barrier is constructed of a plurality of cylindrical foils concentric to the retainer of the cathode cup unit to reduce thermal loss. Each foil functions as a thermal break liner to minimize thermal losses and to maintain a high temperature in the region of the filament.

The filament is coaxially disposed within the cathode cup unit for generating thermal electrons at a face thereof and is spaced from the body of the cathode cup unit a predetermined distance. The face of the filament is flat and the filament has a pair of parallel leads supporting the face.

In addition, the assembly includes a graphite support plate having the leads of the filament passing therethrough and a thermal reflector mounted on the graphite support plate in spaced relation to the face of the filament and with the leads of the filament passing therethrough.

The body of the cathode cup unit, preferably constructed from tungsten, is designed to achieve a very high temperature (i.e. 2,973.15K) to maximize the thermal electron emission.

These and other objects and advantages of the invention will become more apparent from the following detailed description taken in conjunction with the drawings wherein.

Figure 1:
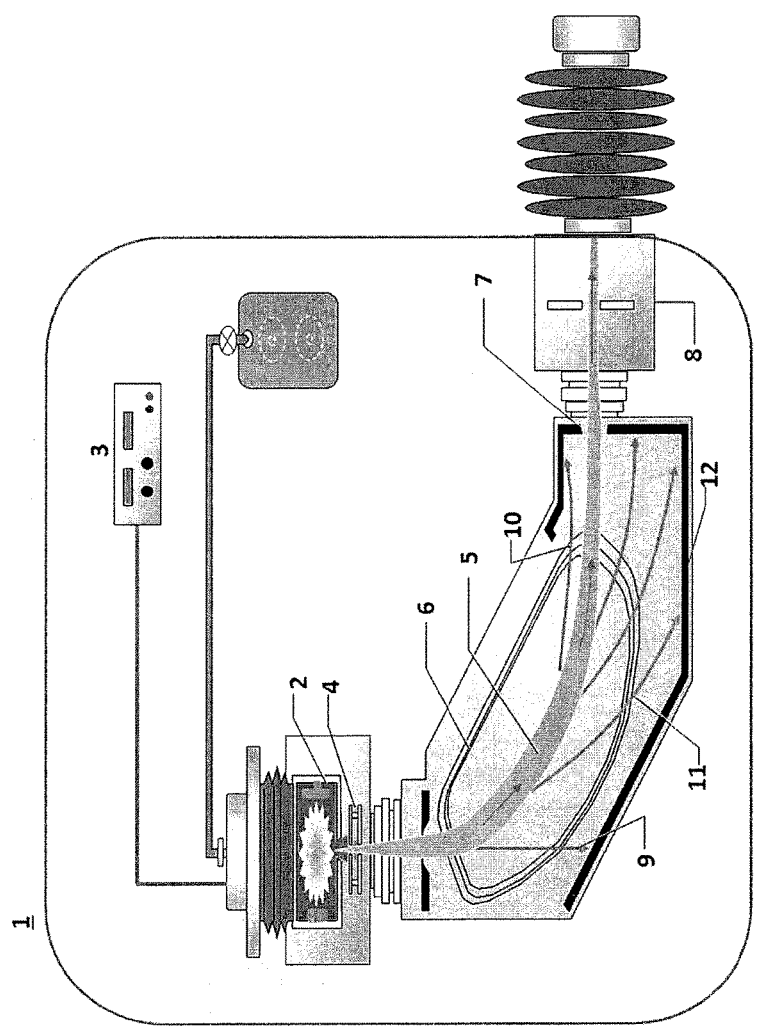
FIG. 1 is a schematic view of an ion implanter for ion beam treatment of a work piece such as a silicon wafer mounted on a substrate holder in accordance with the prior art.

Referring to FIG. 1, the ion implanter 1 of the prior art is constructed with an ion source chamber 2 that is configured to generate ions of a particular species and a power supply 3 that delivers the required energy to the source chamber 2 to generate the ions. The ion source chamber 2 defines an interior region into which source materials are injected. The source materials may include an ionizable gas or vaporized source material.

The generated ions are extracted from the source chamber 2 through a series of electrodes 4 (extraction electrode assembly) that create an ion accelerating electric field and formed into a beam 5 which passes through a mass analyzer magnet 6. The mass analyzer magnet 6 is configured with a particular magnetic field such that only the ions with a desired mass-to-charge ratio are able to travel through the analyzer magnet 6 for maximum transmission through a mass resolving slit 7.

Ions of the desired species pass from the mass slit 7 through a deceleration stage 8. The neutral 9, lighter 10 and heavier 11 ions will be stopped on graphite 12 walls inside of the mass analyzer.

Figure 2:
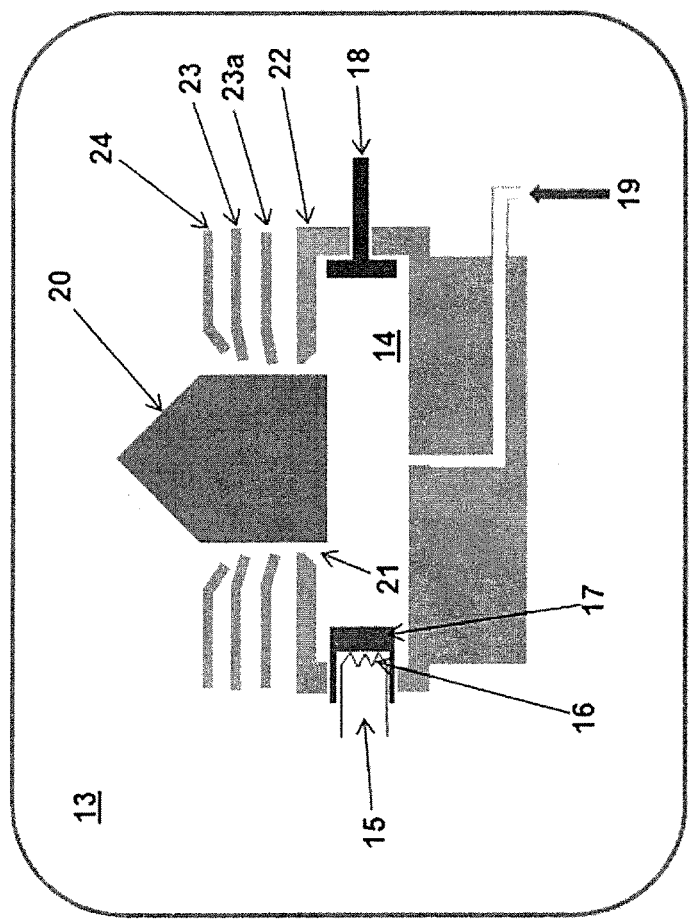
FIG. 2 is the schematic view of an indirectly heated cathode (IHC) ion source and extraction electrodes in accordance with the prior art.

Referring to FIG. 2, an indirectly heated cathode (IHC) ion source 13 is typically used as the ion source chamber in high current applications. As illustrated, the indirectly heated cathode (IHC) ion source 13 includes an arc chamber 14 defined by electrically conductive (e.g. tungsten) chamber walls. The chamber 14 defines an ionization zone within which energy is imparted to a dopant feed gas to generate associated ions. Different feed gases are supplied to the ion source chamber to obtain plasma used to form ion beams having particular dopant characteristics. For example, feed gases, such as $H_2$, $BF_3$, $GeF_4$, $PH_3$, and $AsH_3$, that are introduced as the dopant gas at relatively high chamber temperatures are broken down into mono-atoms having low, medium and high implant energies. These ions are formed into a beam, which then passes through a source filter. The source filter is preferably located near the ion source. The ions within the beam are accelerated/decelerated in a column to the desired energy level. A mass analyzer magnet having an aperture is used to remove unwanted components from the ion beam, resulting in an ion beam having the desired energy and mass characteristics passing through resolving aperture.

The IHC ion source chamber 13 includes a cathode/filament assembly 15 located at one end of the arc chamber 14. A filament 16 is positioned in close proximity to cathode 17 outside the arc chamber 14. A voltage is supplied to the filament 16 which produces enough current through the filament 16 to heat the filament 16 and cause thermionic emission of electrons.

The cathode 17 is indirectly heated via the filament 16 by biasing the cathode 17 more positively than the filament 16 which causes these thermo-electrons to accelerate from the filament 16 toward the cathode 17, thereby heating the cathode 17.

A repeller 18 is typically positioned on the opposite end of the arc chamber 14 and is biased to the same voltage as the cathode 17. The emitted electrons are confined between the cathode 17 and repeller 18 which collide with the dopant feed gas introduced into the chamber via a conduit 19 to generate a plasma having the desired properties.

The ions 20 formed from the dopant gas are extracted from the source chamber 13 via an aperture 21 by way of, for example, a standard three (3) electrode configuration comprising plasma electrode 22, suppression electrode 23 and ground electrode 24 used to create and electric field. Although suppression electrode 23 is shown as being spaced apart from ground electrode 24, this is for illustrative purposes only and the electrodes are physically in contact with each other via insulators. Plasma electrode 22 may be biased at the same large potential as ion source chamber 13. Suppression electrode 23 is connected to a power supply and is typically biased at a moderate negative value to prevent electrons from entering back into source chamber 13. Ground electrode 24 is positioned downstream from suppression electrode 23 and is a ground potential. The strength of the electric field generated by the electrodes can be tuned to a desired beam current to extract a particular type of ion beam from the ions 20 generated in chamber 13. An extraction electrode 23a to control the beam divergence would typically be below the potential of the suppression electrode 23 for low energy beam and above the potential of the suppression electrode 23 for high energy beam.

DETAILED DESCRIPTION OF THE INVENTION

Figure 3:
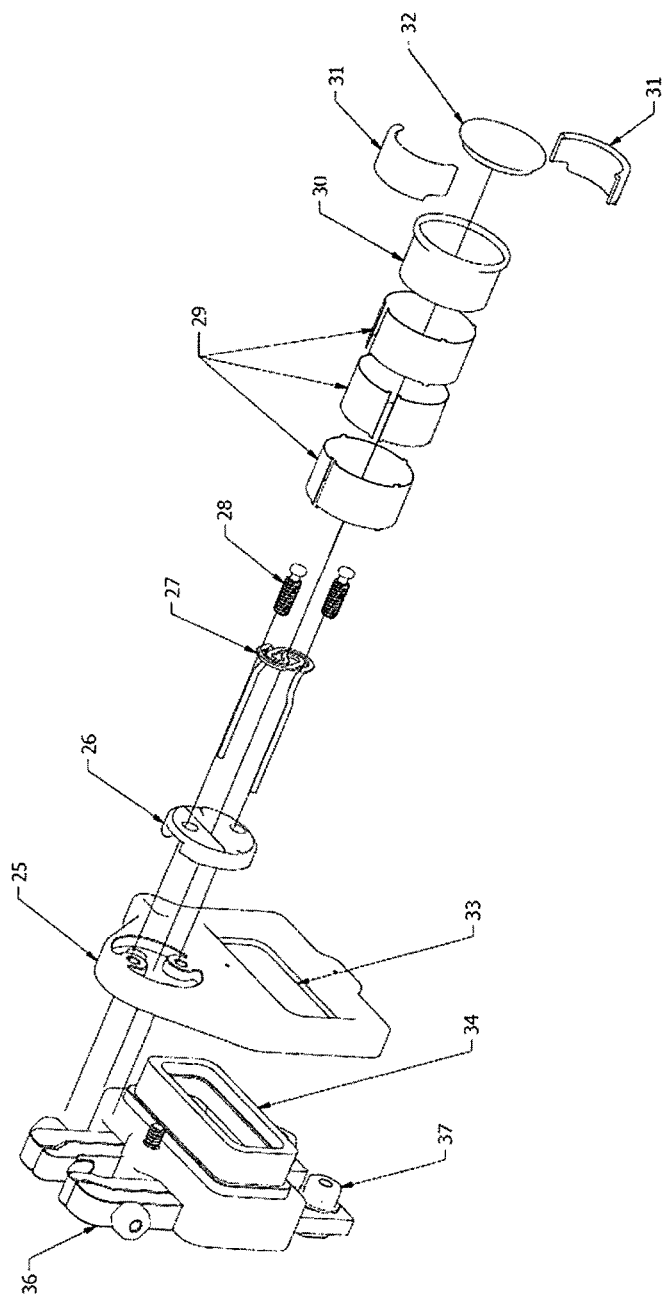
FIG. 3 is an exploded perspective view of an indirectly heated cathode ion source assembly constructed in accordance with the invention.

Referring to FIG. 3, the cathode assembly includes a support plate 25 of graphite that acts as a thermal barrier, a thermal reflector 26 mounted on the support plate 25, a tungsten filament 27, a pair of mounting screws 28, a thermal break (barrier) 29, and a cathode cup unit formed of a retainer 30, a pair of semicircular elements 31 and a disc-shaped body 32.

Figure 7:
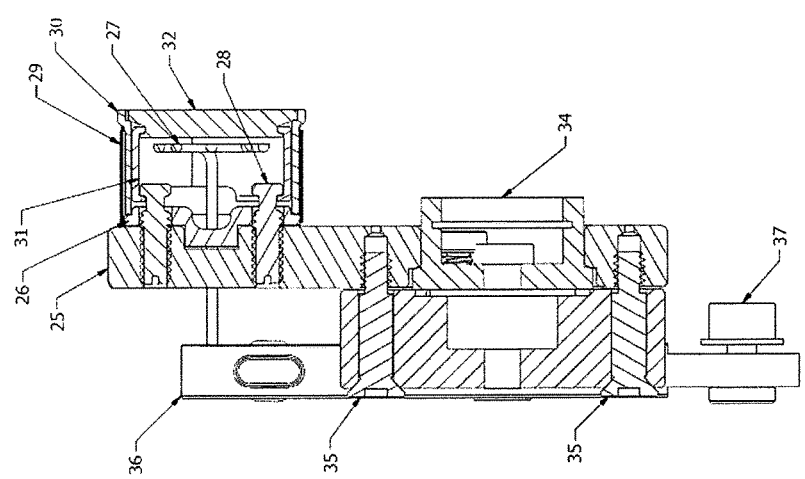
FIG. 7 is a cross-sectional view taken on line A-A of FIG. 6.

Referring to FIGS. 3 and 7, the support plate 25 has an aperture 33 of rectangular shape for fitting onto an insulator block of alumina ($Al_2O_3$) 34. In addition, the support plate 25 is secured by a pair of screws 35 to a filament clamp 36. As indicated in FIG. 7, the insulator block 34 has an outer stepped configuration to mate within a stepped configuration on the aperture 33 and is held in place by the filament clamp 36.

Figure 6:
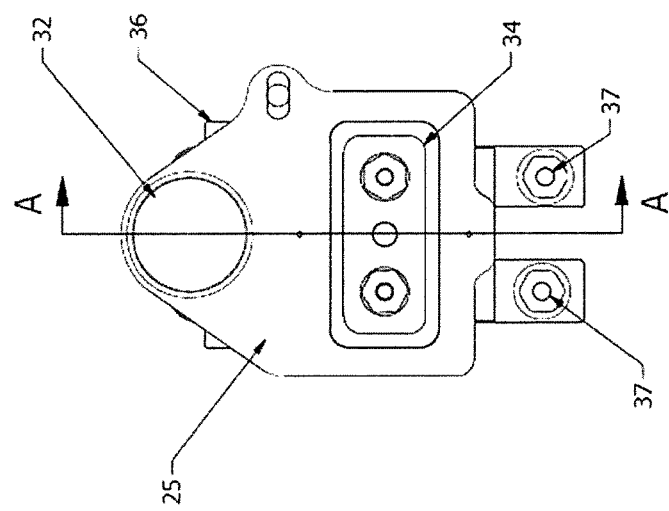
FIG. 6 is a front view of the cathode assembly of FIG. 3.

Referring to FIGS. 3, 6 and 7, the filament clamp 36 has a pair of screws 37 for connecting a strap (not shown) to a power supply (not shown).

Figure 4:
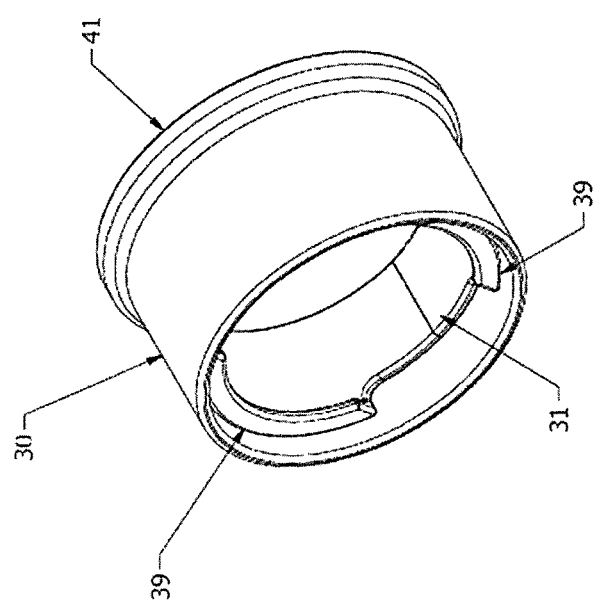
FIG. 4 is a perspective view of the cathode cup unit of FIG. 3.
Figure 5:
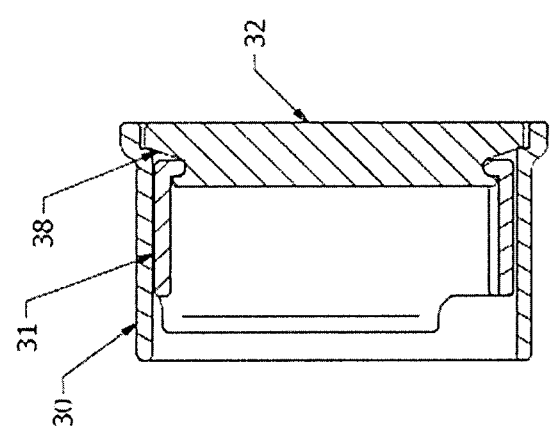
FIG. 5 is a diametric cross sectional view of the cathode cup unit of FIG. 4.

Referring to FIGS. 4 and 5, the body 32 of cathode cup unit is made of tungsten and has a stepped cross-section with an annular recess 38 in the smaller diameter portion.

Each of the semicircular elements 31 has an inwardly directed flange 39 at each end. The flange 39 at a forward end of an element 31, as viewed, extends over the entire periphery of the element 31 while the flange 39 at the rear end of an element 31, as viewed, extends over only a major portion of the periphery leaving a gap at each end for assembly purposes as explained below.

As indicated in FIG. 3, each element 31 has a notch 40 coincident with the gap in the flange 39.

The retainer 30 is of cylindrical sleeve shape with a radially outwardly extending bell-shaped collar 41 at one end. As indicated in FIG. 5, the collar 41 receives the stepped tungsten body 32 in a flush manner and the remainder of the retainer 30 receives the semicircular elements 31.

During assembly, the flanges 39 at the forward ends of the semicircular elements 31 are fitted into the annular recess 38 of the tungsten body 32 to form a support for the body 32 and the retainer 30 is slid over the semicircular elements 31 to hold them in place and fitted over the body 32 (see FIGS. 3 and 5).

Referring to FIGS. 3, 7, 8 and 9, the thermal break (barrier) 29 is formed of a plurality of cylindrical foils, i.e. three foils, concentric to the retainer 30 with a very small gap (0.004") therebetween to reduce thermal loss.

The three thermal breaks 29 are made of a high melting point material, including tungsten (W) and tantalum (Ta), for example, and are of split construction. In addition, each circular foil 29 is heat treated to keep a round form shape. Due to the split construction, each foil 29 has a spring like action.

In order to maintain a high temperature on the cathode cup body 32, each thermal break 29 should have a shape that is long in the axial direction and a very small wall thickness, to reduce the thermal conductivity.

Figure 8:
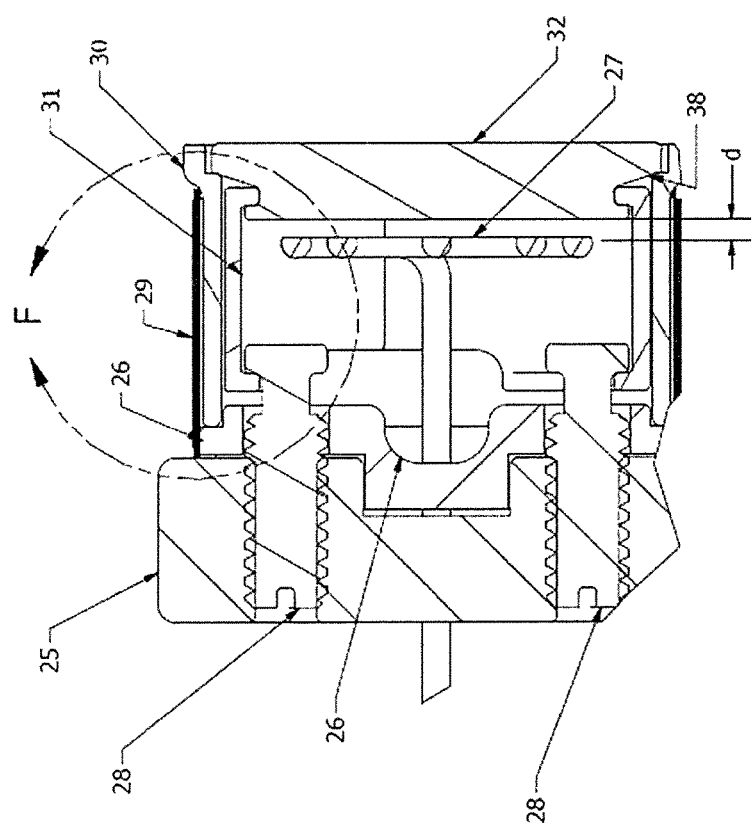
FIG. 8 is an enlarged partial cross-sectional view of the cathode assembly of FIG. 6.

Referring to FIGS. 7 and 8, the filament 27 is coaxially disposed within said cathode cup unit for generating thermal electrons at a face thereof spaced from the tungsten body 32 a predetermined distance d (see FIG. 8). The face of the filament 27 is flat, for example, being grounded flat to reduce the cross-section to increase the electrical resistivity. The reduced cross-section on the filament 27 will increase the temperature and improve the thermal electron emission during use. The filament 27 also has a pair of parallel leads supporting the flat face and extending through the thermal reflector 26 and graphite support plate 25 into the filament clamp 36. (See FIG. 1).

Referring to FIGS. 3 and 7, the screws 28 serve to mount the cathode cup unit on the graphite support plate 25.

As shown in FIG. 7, the two screws 28 are threaded into the support block 25 while passing through the thermal reflector 26 in an unthreaded manner. Each screw 28 has an enlarged head sized such that a flange 39 of each semicircular element 31 of the cathode cup unit can be seated behind the head.

During assembly, after assembling the cathode cup unit 30, 31, 32, each thermal break (foil) 29 is loosely slid over the retainer 30.

The resulting assembly is then slid over the heads of the screws 28 with the heads passing through the gap defined between the partial flanges 39. The cathode cup unit is then rotated to bring the flanges 39 behind the heads of the screws 28.

The graphite support plate 25, will work as thermal barrier, from the heat flow towards the filament clamp 36. The thermal reflector 26 is supported by the screws 28, and is thermally disconnected from the circular thermal reflector retainer 30.

During use, the cathode cup unit 30, 31, 32 for emitting thermal electrons into an arc chamber, for example, as in FIG. 2, is exposed to plasma. The ions produced on the plasma will sputter the body 32 of the cathode cup unit and may wear down with the use of the ion source.

In order to minimize the cathode cup body 32 wear and improve the lifetime, the cathode cup body 32 has a reduced mass and the cathode support elements 31 and retainer 30 act as a thermal reflector to minimize the thermal loss. With the cathode cup body 32 reduced mass and the reduced thermal losses, the cathode cup body 32 can achieve a temperature of 2,973.15K (2,700° C.). The cathode cup body 32 is preferably maintained at a high temperature in order to improve the generation efficiency of thermal electrons.

The filament 27 is heated by a filament power supply 3, e.g. as in FIG. 1, and generates thermal electrons at the front end thereof. The primary thermal electrons at a front the filament 27 are accelerated in a cathode electric field generated by the cathode power supply 3. These thermal electrons collide with the cathode cup body 32, which is heated with the heat generated by the energy of the collision. The cathode is normally operated in a space charge limited mode, in which the emission temperature is sufficient to produce a potential minimum a short distance from the cathode cup body 32. In the space charge limited region, the current may be calculated by the Child-Langmuir Laws:

$$J_e = \frac{4\varepsilon_0}{9d^2}\sqrt{\frac{2e}{m_e}}V^{3/2}$$

where $\varepsilon_0$ is the permittivity of free space, e is the electron charge, $m_e$ is the electron mass, V is the voltage applied between filament 27 and cathode cup body 32, and d is the distance between filament 27 and cathode body 32.

The cathode cup body 32 is preferably maintained at a high temperature in order to improve the generation of thermal electrons, and the two elements 31 of the thermal break are attached and held together using the tubular retainer (thermal reflector) 30 to reduce the thermal losses.

As indicated in FIG. 8, the filament 27 should be optimized from the cathode cup at distance "d". The optimum distance "d" between filament 27 and back surface of the cathode cup body 32, should be defined by Child-Langmuir Laws.

Figure 9:
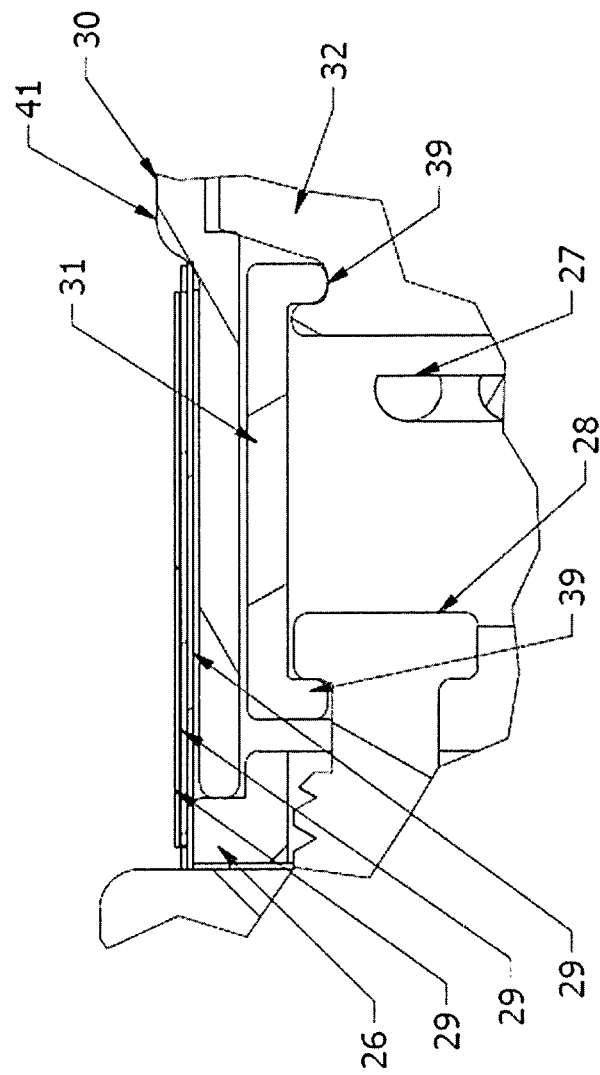
FIG. 9 is an enlarged partial cross-sectional view of the thermal break liners of the cathode assembly of FIG. 6.

As indicated in FIG. 9, the three concentric circular tungsten foils 29 have a very small gap between each circular foil. Each circular tungsten foil has a minimum thickness and large surface area to reduce the thermal conductivity $$k = \frac{Q \Delta x}{A(T_2 - T_1)},$$

where Q is rate of heat transferred, $\Delta x$ is the foil thickness, A is the surface area of the foil, and T is the temperature. Each circular foil 29 will reduce the thermal losses, working as a thermal barrier. The thermal break (barrier) will help to maintain the high temperature in the region of the filament 27 and back surface of the cathode cup body 32. The thermal break will minimize the thermal losses.

By way of example, the three tungsten foils 29 may have a nominal radial space (gap) of 0.002 inches. During operation, each foil 29 will expand under heat and the gap can increase thereby improving the thermal break (barrier).

Referring to FIG. 9, the flange 39 at the forward end of each semicircular elements 31 contacts the cathode body 32 over a small surface contact point within the recess 38 of the cathode body 32 while the flange 39 at the rear end of each semicircular elements 31 contacts the enlarged head of a screw 28 over a small surface contact point. In addition, the retainer 30 contacts the cathode body 32 over a small surface contact point and contacts the thermal reflector 26 over a small surface contact point. These four small surface contact points function as thermal breaks helping to keep a high temperature on the cathode body 32 during operation.

As illustrated, the retainer 30 is radially spaced from the semicircular elements 31 and the innermost foil 29 is seated on the thermal reflector 28 and a raised portion of the retainer 30 formed by the collar 41 so that the remainder of the innermost foil 29 is radially spaced form the retainer 30.

Figure 10:
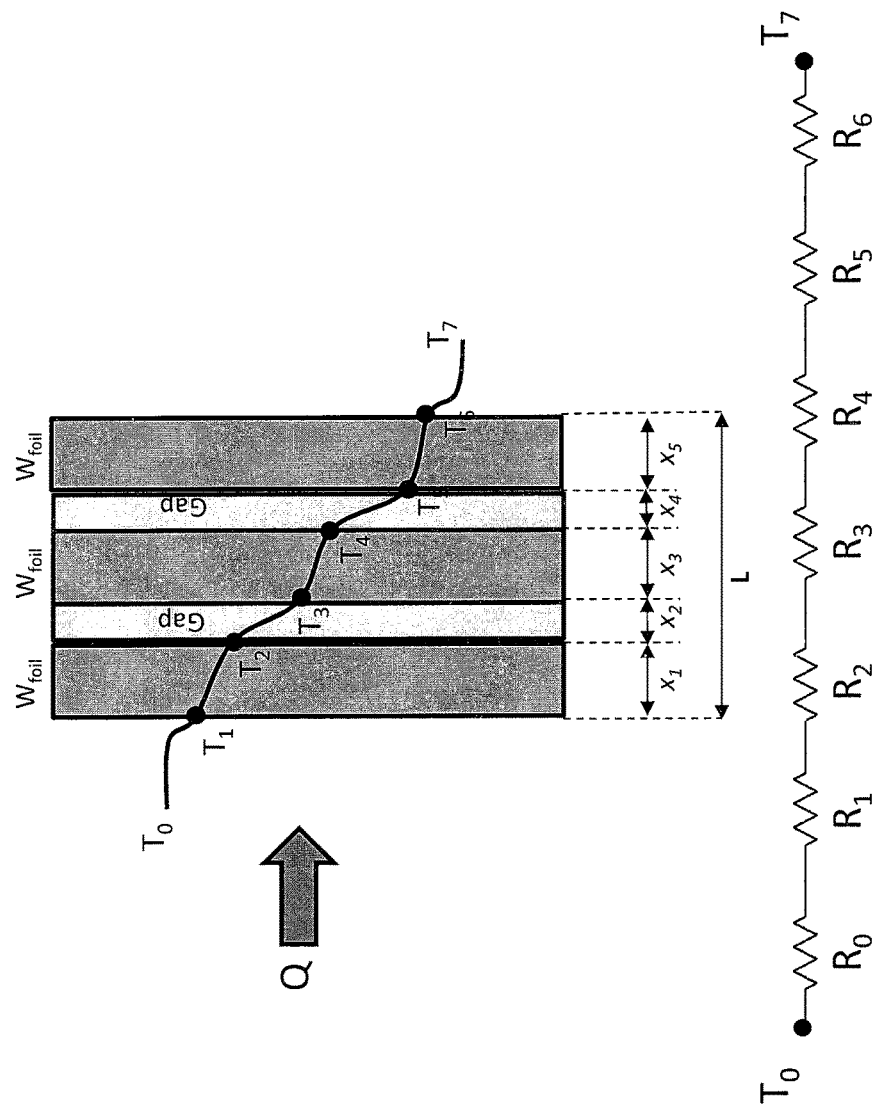
FIG. 10 is a graphical illustration of the temperature drop and thermal resistance changes through the thermal break liners in accordance with the invention.

As indicated in FIG. 10, the temperature will drop through each thermal break (barrier) 29. The multiple thermal breaks (barrier) 29 increase the thermal resistance. The total thermal resistance is $R_{total} = R_1 + R_2 + R_3 + R_4 + R_5 + R_6$, where $$R_i = \frac{L_i}{k_i A_i}$$

and the rate of heat transfer per unit of area is $$Q = \frac{T_7 - T_0}{R_{total}}.$$

The cathode assembly is thus provided with a reduced mass cathode cup unit 30, 31,32 due to the use of three small parts 31, 32. In addition, the cathode assembly is provided with a thermal break barrier (foils) 29, small surface contact points between the elements and small radial gaps between parts. These features significantly provide for an increased surface temperature on the cathode body 32 during use.

The invention thus provides a cathode assembly with an improved life performance of a cathode assembly during ion beam operation.

The invention also provides an indirectly heated cathode (IHC) ion source assembly that can be used in all ion source arrangements, that can be fitted in OEM implant systems as well as iTS ion sources and that reduces the number of parts, improves the thermal electron emission, reduces the cathode erosion and reduces ion implanter downtime.

What is claimed is:

1. An indirectly heated cathode ion source assembly for use in creating a stream of ions comprising
   a cathode cup unit having a disc-shaped body, a pair of semicircular elements concentric to and holding said body therebetween and a cylindrical retainer concentrically housing said body and said elements and forming a thermal reflector;
   a thermal barrier having a plurality of cylindrical foils concentric to said retainer of said cathode cup unit to reduce thermal loss;
   a filament coaxially disposed within said cathode cup unit for generating thermal electrons at a face thereof spaced from said body a predetermined distance, said filament having a pair of parallel leads supporting said face;
   a graphite support plate having said leads of said filament passing therethrough; and
   a thermal reflector mounted on said graphite support plate in spaced relation to said face of said filament and with said leads of said filament passing therethrough.

2. An assembly as set forth in claim 1 wherein said body of said cathode cup unit is made of tungsten.

3. An assembly as set forth in claim 1 wherein said face of said filament is flat.

4. An assembly as set forth in claim 1 further comprising a pair of mounting screws threaded into said graphite support plate and supporting said semicircular elements of said cathode cup unit thereon.

5. An assembly as set forth in claim 4 wherein each said mounting screw has an enlarged head and each said semicircular element has an inwardly directed flange seated behind said head relative to the direction of said face of said filament.

6. An assembly as set forth in claim 5 wherein said body of said cathode cup unit has an annular recess and each said semicircular element has a second inwardly directed flange seated in said annular recess.

7. A cathode sub-assembly structure for use with an ion source for generating a beam of ions comprising
   a thermal electron emitter for emitting thermal electrons into an arc chamber of a plasma generation region in which a magnetic field is applied, said thermal electron emitter comprising
      a cathode cup unit having a disc-shaped body, a pair of semicircular elements concentric to and holding said body therebetween and a cylindrical retainer concentrically housing said body and said elements and forming a thermal reflector; and a thermal barrier concentric to said retainer of said cathode cup unit to reduce thermal loss.

* * * * *